United States Patent

Kamata

[11] Patent Number: 6,025,658
[45] Date of Patent: *Feb. 15, 2000

[54] LINEAR MOTOR, AND STAGE APPARATUS AND EXPOSURE APPARATUS USING THE SAME

[75] Inventor: Shigeto Kamata, Yokohama, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/845,884

[22] Filed: Apr. 28, 1997

[30] Foreign Application Priority Data

May 10, 1996 [JP] Japan ................................. 8-116224

[51] Int. Cl.[7] .................................................. H02K 41/00
[52] U.S. Cl. ............................................................. 310/12
[58] Field of Search ................................ 310/12, 13, 14; 318/135

[56] References Cited

U.S. PATENT DOCUMENTS

| | | | |
|---|---|---|---|
| 4,916,340 | 4/1990 | Negishi | 310/12 |
| 5,519,266 | 5/1996 | Chitayat | 310/12 |
| 5,723,929 | 3/1998 | Niimi | 310/154 |
| 5,753,991 | 5/1998 | Couture et al. | 310/156 |

*Primary Examiner*—Nestor Ramirez
*Assistant Examiner*—Judson H. Jones
*Attorney, Agent, or Firm*—Fitzpatrick, Cella, Harper & Scinto

[57] ABSTRACT

In order to provide a good linear motor device which can enjoy low cost and high driving power but has small thrust ripples, in a linear motor in which permanent magnets move relative to a coil, a plurality of permanent magnets are arranged along the moving direction while rotating their polarity directions 90° each in turn to generate a sine magnetic field. Each permanent magnet has a simple rectangular parallelopiped shape, and two or more coils of a polyphase coil are simultaneously energized.

17 Claims, 5 Drawing Sheets

6,025,658

LINEAR MOTOR, AND STAGE APPARATUS AND EXPOSURE APPARATUS USING THE SAME

BACKGROUND OF THE INVENTION

1. Field of the Invention

The present invention relates to a linear motor suitable for driving a stage apparatus applied to an exposure apparatus used in the semiconductor manufacturing process.

2. Related Background Art

FIG. 10 shows the layout of permanent magnets used in a conventional linear motor. FIG. 10 shows only one of opposing permanent magnet groups. In FIG. 10, permanent magnets 10a to 10c are arrayed on a yoke 4. Each permanent magnet has a non-rectangular parallelopiped shape formed by cutting off the corner portions. The plurality of permanent magnets 10a to 10c are arrayed so that poles of opposite polarities (N and S poles) alternately appear, and the thicknesses and widths of the individual permanent magnets are determined so as to generate a sine magnetic field in the space between the opposing stator groups.

SUMMARY OF THE INVENTION

However, in the above-mentioned conventional art, the individual permanent magnets must have different thicknesses and widths depending on their positions so as to generate a sine magnetic field, and the shape of each permanent magnet is not a simple rectangular parallelopiped shape. For these reasons, it is difficult to manufacture the permanent magnets with high precision, resulting in high cost. Since the magnetic flux density of each permanent magnet is lower than that of a rectangular parallelopiped magnet, the driving force of the linear motor lowers.

The present invention has been made in consideration of the above situation, and has as its object to provide a good linear motor device which can enjoy low cost and high driving power but has small thrust ripples (thrust nonuniformity). It is another object of the present invention to provide a stage apparatus or an exposure apparatus, which uses the linear motor and has high positioning precision.

In order to achieve the above objects, according to the present invention, a linear motor with an arrangement in which permanent magnets move relative to a coil is characterized in that a plurality of permanent magnets are arrayed along a moving direction while rotating their polarity directions 90° each so as to generate a sine magnetic field.

Each permanent magnet preferably has a rectangular parallelopiped shape. Also, a plurality of coils are preferably arranged along the moving direction, so that two or more coils are concurrently energized. More preferably, a permanent magnet having a volume smaller than other permanent magnets is arranged at the terminal end portion of the array of the plurality of permanent magnets.

A stage apparatus of the present invention is characterized by moving a stage using the above-mentioned linear motor as a driving source. An exposure apparatus of the present invention is characterized by having the above-mentioned stage apparatus.

DETAILED DESCRIPTION OF THE PREFERRED EMBODIMENTS

Figure 1:
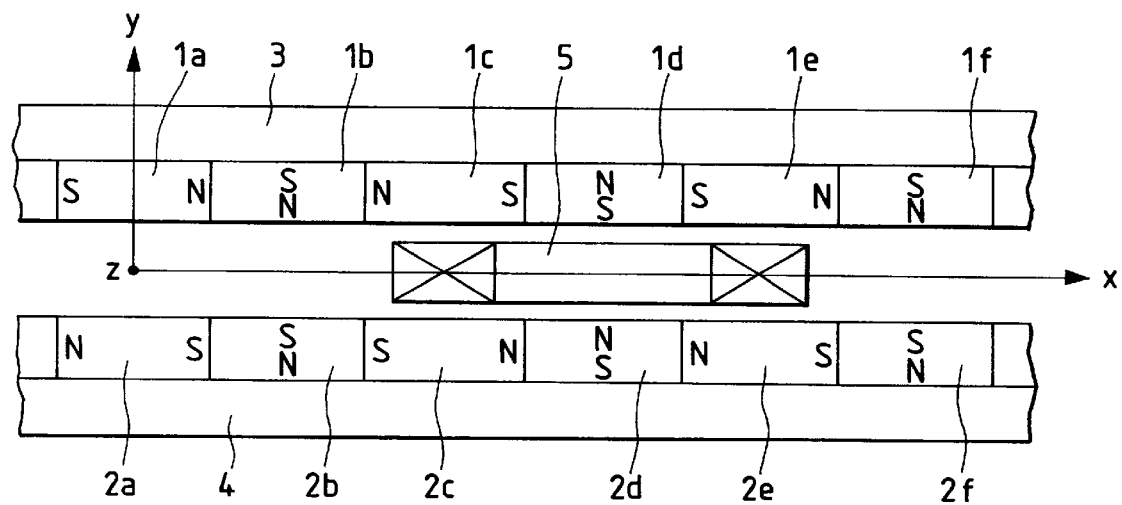
FIG. 1 is a side view showing the arrangement of a linear motor according to an embodiment of the present invention.

FIG. 1 shows an embodiment of the present invention. In FIG. 1, a group of permanent magnets 1a to 1f are arrayed in the x-direction in FIG. 1 and are fixed on a yoke 3, and a group of permanent magnets 2a to 2f are similarly arrayed in the x-direction and are fixed on a yoke 4. These opposing permanent magnet groups build a rotor of a linear motor. An electromagnetic coil 5 as a polyphase coil serves as a stator of the linear motor. When a current is supplied to the coil 5, a force is produced between the stator and rotor. Note that the permanent magnet groups may serve as a stator, and the electromagnetic coil 5 may serve as a rotor.

The permanent magnets 1a to 1f are arranged on the yoke 3 while rotating their polarity directions (the direction from N to S poles) clockwise 90° each in turn, and the permanent magnets 2a to 2f are arranged on the yoke 4 while rotating their polarity directions counterclockwise 90° each in turn. The permanent magnets 1a to 1f, and 2a to 2f have opposite directions of rotation of the polarity directions. That is, when the permanent magnets 1a to 1f change their polarities clockwise about the z-axis in FIG. 1, the permanent magnets 2a to 2f change their polarities counterclockwise.

More specifically, the permanent magnet 1a has S and N poles in the order named from the left to right in FIG. 1 along the x-axis; the permanent magnet 1b has S and N poles along the y-axis and the N pole is located on the electromagnetic coil 5 side; the permanent magnet 1c has N and S poles in the order named from the left to right in FIG. 1 along the x-axis; the permanent magnet 1d has S and N poles along the y-axis and the S pole is located on the electromagnetic coil 5 side; the permanent magnet 1e has S and N poles in the order named from the left to right in FIG. 1 along the x-axis; and the permanent magnet 1f has S and N poles along the y-axis and the N pole is located on the electromagnetic coil 5 side. Also, the permanent magnet 2a opposing the permanent magnet 1a has N and S poles in the order from the left to right in FIG. 1 along the x-axis to have polarities opposite to those of the permanent magnet 1a; the permanent magnet 2b opposing the permanent magnet 1b has S and N poles along the y-axis to have polarities opposite to those of the permanent magnet 1b and the S pole is located on the electromagnetic coil 5 side; the permanent magnet 2c opposing the permanent magnet 1c has S and N poles in the order named from the left to right along the x-axis to have polarities opposite to those of the permanent magnet 1c; the permanent magnet 2d opposing the permanent magnet id has S and N poles along the y-axis to have polarities opposite to those of the permanent magnet 1d and the N pole is located on the electromagnetic oil 5 side; the permanent magnet 2e opposing the permanent magnet 1e has N and S poles in the order named from the left to right in FIG. 1 along the x-axis to have polarities opposite to those of the permanent magnet 1e; and the permanent magnet 2f opposing the permanent magnet 1f has S and N poles along the y-axis to have polarities opposite to those of the permanent magnet 1f and the S pole is located on the electromagnetic coil 5 side.

Figure 2:
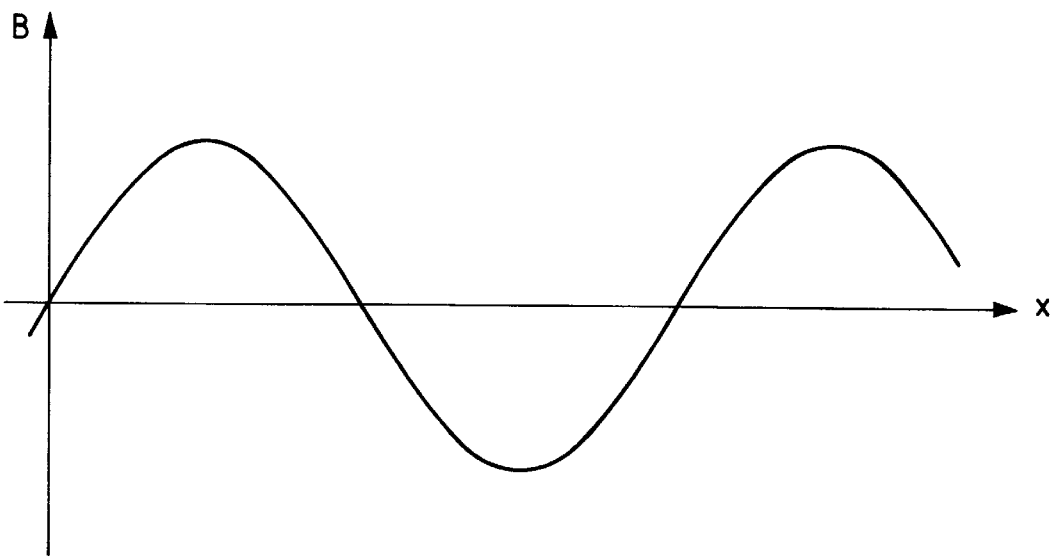
FIG. 2 is a graph showing the sine magnetic flux density curve generated by permanent magnets shown in FIG. 1.

On the other hand, the yokes 3 and 4 are fixed in position with respect to each other, and a permanent magnetic field determined by the above-mentioned layout is produced in the space between the opposing permanent magnets 1a to 1f and 2a to 2f. With the above-mentioned layout of the permanent magnets, the y-components of the magnetic field present in the space between the permanent magnets 1a to 1f and 2a to 2f can define a sine curve with respect to the x-axis direction. FIG. 2 shows the y-components of the magnetic flux density of this magnetic field.

Figure 3:
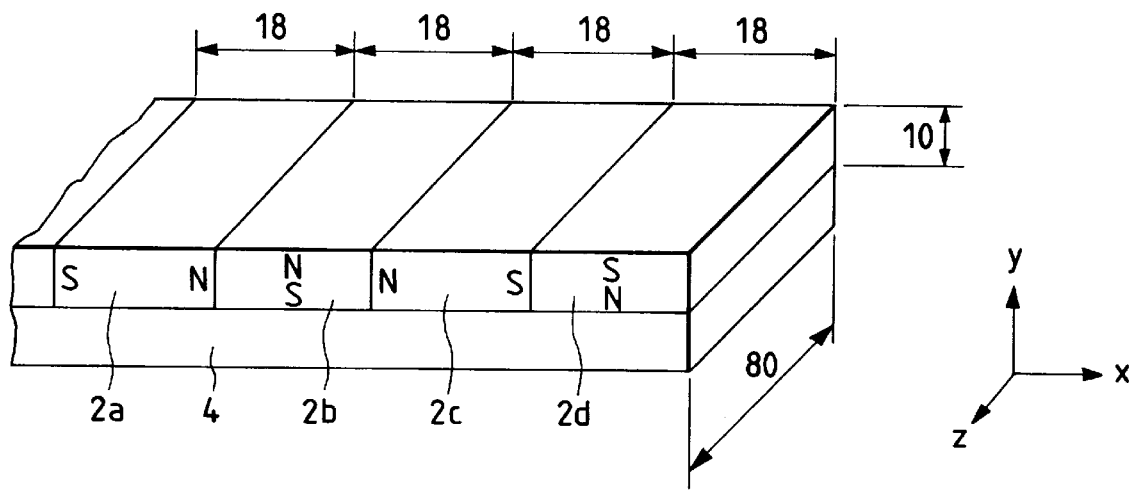
FIG. 3 is a perspective view showing an example of the detailed design of the permanent magnets of the device shown in FIG. 1.

FIG. 3 shows an example of the detailed design of the permanent magnets. The lengths of the permanent magnets 2a to 2f (the same applies to the permanent magnets 1a to 1f) in the direction of relative motion (x-direction) between the coils and the permanent magnets are set so that the permanent magnets 2a, 2c, and 2e (the magnet 2e is not shown in FIG. 3) having a magnet polarity direction agreeing with the x-direction, and the permanent magnets 2b, 2d, and 2f (the magnet 2f is not shown in FIG. 3) having a magnet polarity direction agreeing with the y-direction perpendicular to the x-direction have the same lengths, e.g., 18 mm. In this case, the permanent magnets in the two directions have the same size, but they may often have different sizes. Since the former and latter permanent magnets are alternately arranged, permanent magnets having the same size are alternately arranged in the x-direction in this embodiment. The thickness (y-direction) of each permanent magnet is set at, e.g., 10 mm, and the width (z-direction) is set at, e.g., 80 mm, so that all magnets have the same dimensions.

In FIG. 1, when a current is supplied to the electromagnetic coil 5 located in the sine magnetic field, a Lorentz force is generated between the permanent magnets and the coil 5, and the permanent magnets (rotor) move in the x-direction with respect to the coil (stator). The electromagnetic coil 5 in FIG. 1 is simply illustrated as a single coil. However, in practice, the coil 5 comprises a polyphase coil obtained by arranging a plurality of coils in the x-direction at predetermined intervals, and so-called polyphase energization for simultaneously supplying currents to the plurality of coils is performed. As an example of the polyphase energization, a case will be exemplified below wherein currents are to be supplied to two-phase coils. Assuming that the first coil is located at one point (position x) in the sine magnetic field, if a constant current is supplied to this coil, the thrust is defined by a sine curve with respect to the position x of the coil. If $I_1$ represents the current (constant value), the thrust is expressed by:

$$F_1(x) = K \cdot B \cdot I_1 \cdot \sin(2\pi x/a)$$

where K is a constant determined by the coil, B is the amplitude of the magnetic flux density, and a is the wavelength of the sine curve.

Assuming that the second coil is always separated by a distance a/4 from the first coil in the x-direction, and is integrated with the first coil, if a constant current is supplied to the second coil, the thrust is defined by a sine curve with respect to the position x of the first coil. If $I_2$ represents the current (constant value), the thrust is expressed by the following equation using the position x of the first coil:

$$F_2(x) = K \cdot B \cdot I_2 \cdot \sin(2\pi(x + a/4)/a)$$
$$= K \cdot B \cdot I_2 \cdot \cos(2\pi x/a)$$

When currents are simultaneously supplied to the two-phase coils, i.e., the first and second coils, the total thrust is described by:

$$F = F_1 + F_2$$
$$= K \cdot B(I_1 \cdot \sin(2\pi x/a) + I_2 \cdot \cos(2\pi x/a))$$

If the currents given by the equations below are supplied to the first and second coils in correspondence with the position x of the first coil:

$$I_1 = I \cdot \sin(2\pi x/a)$$
$$I_2 = I \cdot \cos(2\pi x/a)$$

(for I: constant value)
then total thrust is:

$$F = K \cdot B \cdot I$$

Figure 4:
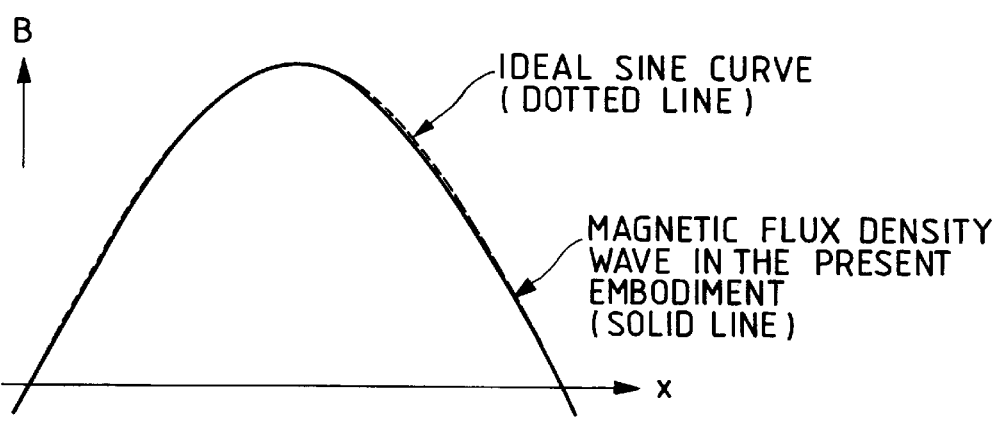
FIG. 4 is a graph showing the magnetic flux density generated by the permanent magnets shown in FIG. 3.

As described above, when the polyphase coils are energized in an ideal sine magnetic field, ripples of the thrust can be reduced. When the magnetic field has very small errors with respect to the sine curve, ripples of the total thrust can be reduced very much. In this manner, when currents are supplied to polyphase coils in a sine magnetic field or approximately sine magnetic field, the thrust becomes constant or nearly constant, and a good linear motor with small thrust ripples can be realized. When permanent magnets with the shape shown in FIG. 3 are used, the y-components of the magnetic field present in the space between the permanent magnets can define nearly an ideal sine curve, and errors from the ideal sine curve can be reduced to 2% or less of the sine curve amplitude. FIG. 4 shows the waveforms corresponding to a ½ period of the sine curve. The dotted line represents the ideal sine curve, and the solid line represents the magnetic flux density wave of this embodiment. As can be seen from FIG. 4, the two waveforms substantially match each other.

According to the above embodiment, since a sine magnetic field can be generated in the space in which the coil is present, the space between the permanent magnets can be effectively used, the magnetic flux density can be increased, and consequently, the thrust of the linear motor can be improved. Since the thrust ripples of the linear motor can be eliminated by supplying sine currents to the polyphase coils, the performance of the linear motor such as the thrust characteristics, positioning characteristics, and the like can be improved.

Figure 5:
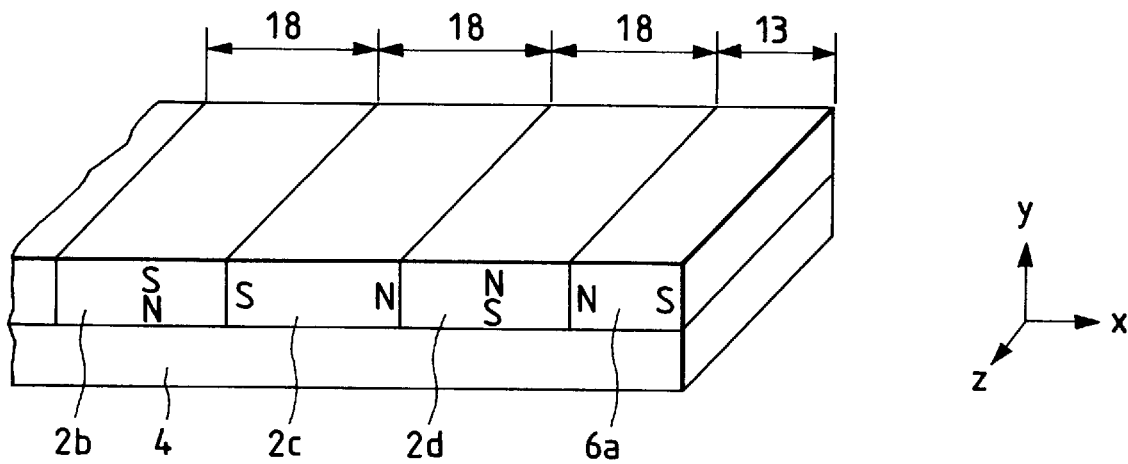
FIG. 5 is a perspective view showing an example of the design of permanent magnets according to a modification.
Figure 6:
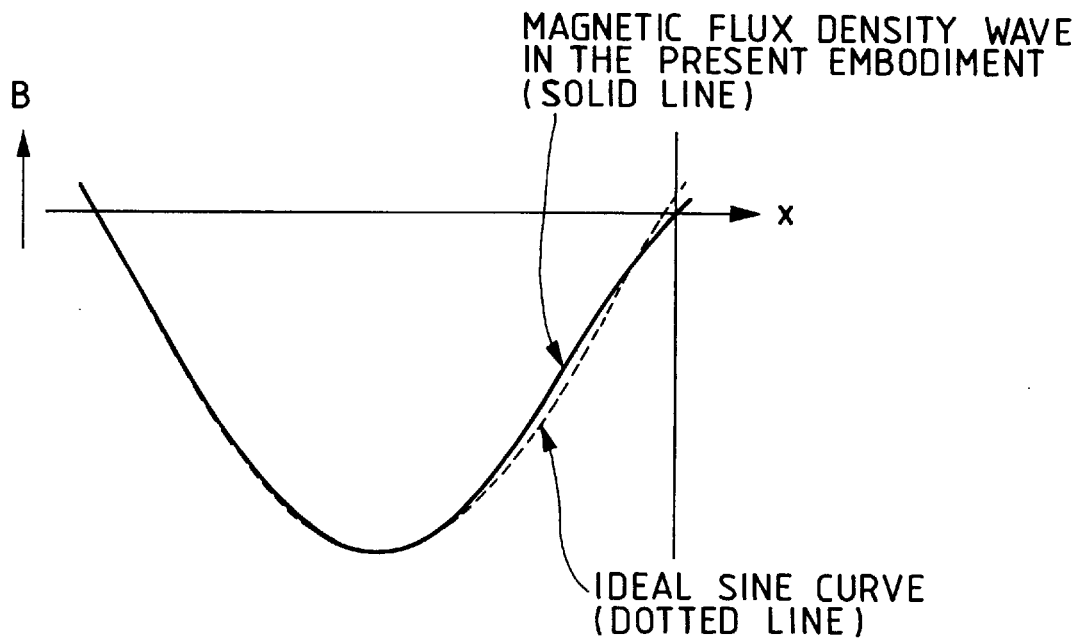
FIG. 6 is a graph showing the sine magnetic flux density curve generated by the permanent magnets shown in FIG. 5.

FIG. 5 shows a modification of the permanent magnet groups of the linear motor. A rectangular parallelopiped permanent magnet 6a is one of the plurality of permanent magnets that form the rotor, and is located at the terminal end portion of the permanent magnet array. The permanent magnet 6a that builds the terminal end portion has a smaller size in the x-direction and a smaller volume than those of other permanent magnets 2b to 2d (other permanent magnets are not shown in FIG. 5). Since the size of the end permanent magnet 6a in the x-direction is set to be smaller than that of other permanent magnets, e.g., is set at 13 mm, the y-components of the magnetic flux density generated in the space between the opposing permanent magnets can define nearly a sine curve, and especially, even at the terminal end portion of the permanent magnet array, errors from the ideal sine wave can be reduced to 5% or less of the sine curve amplitude. FIG. 6 shows the waveforms at the terminal end portion corresponding to a ½ period of the sine curve. In FIG. 6, the right side (+x side) corresponds to the terminal end portion, the dotted line represents the ideal sine curve, and the solid line represents the magnetic flux density of this embodiment. As can be seen from FIG. 6, the two waveforms substantially match each other.

Figure 7:
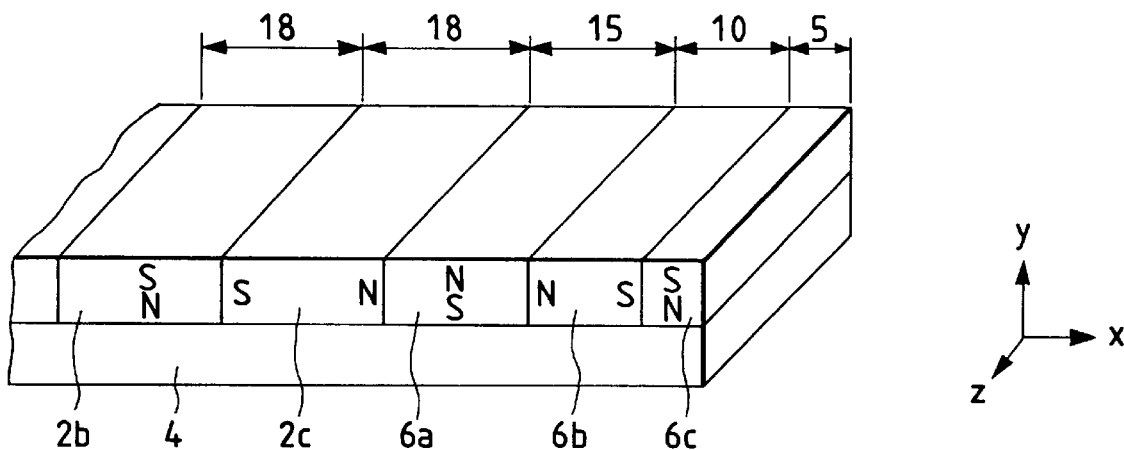
FIG. 7 is a perspective view showing an example of the design of permanent magnets according to another modification.
Figure 8:
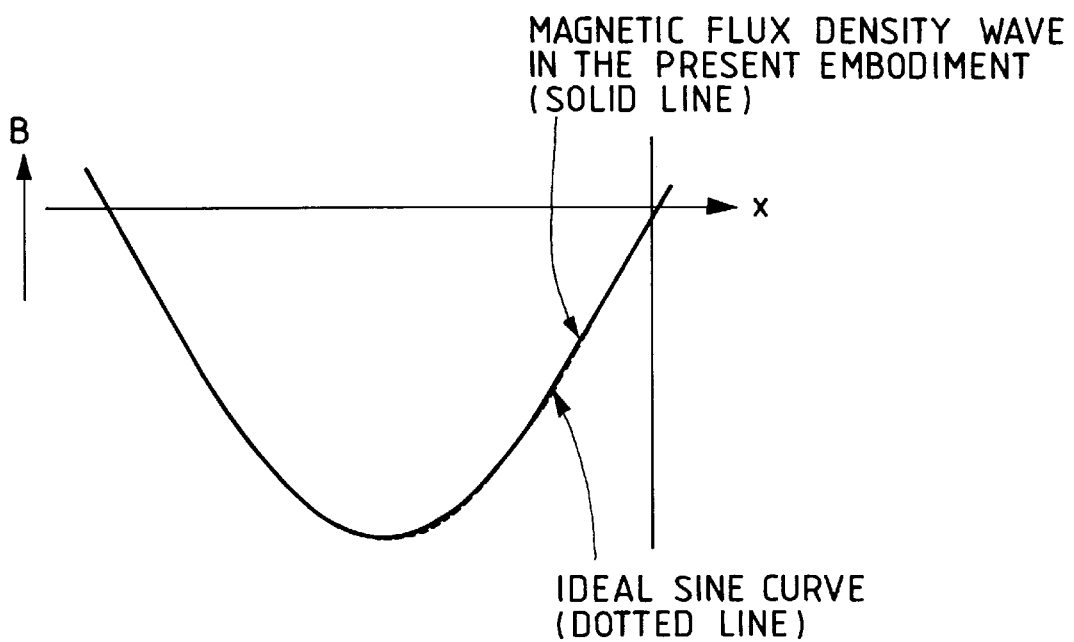
FIG. 8 is a graph showing the magnetic flux density generated by the permanent magnets shown in FIG. 7.

FIG. 7 shows another modification. Rectangular parallelopiped permanent magnets 6a to 6d are those located on the terminal end portion side of the plurality of permanent magnets that form the rotor. The three permanent magnets 6a to 6c that build the terminal end portion have smaller sizes in the x-direction and smaller volumes than those of other permanent magnets 2b to 2c shown in FIG. 7. When the sizes of the end permanent magnets in the x-direction are decreased in turn, e.g., the size of the permanent magnet 6a in the x-direction is set at 15 mm, that of the permanent magnet 6b is set at 10 mm, and that of the permanent magnet 6c is set at 5 mm, the y-components of the magnetic flux density generated in the space between the opposing permanent magnets can define a curve very close to the sine curve, and especially, even at the terminal end portion of the permanent magnet array, errors from the ideal sine curve can be reduced to as very small as 2% or less of the sine curve amplitude. In FIG. 8, the right side (+x side) corresponds to the terminal end portion, the dotted line represents the ideal sine curve, and the solid line represents the magnetic flux density of this embodiment. As can be seen from FIG. 8, the two waveforms substantially match each other.

As in the modifications shown in FIGS. 5 and 7, when at least one permanent magnet having a smaller volume is arranged at the end portion of the magnet array, a magnetic flux density close to the ideal sine curve can be maintained even at the terminal end portion of the permanent magnet array, and hence, a good linear motor which has small thrust ripples even at the terminal end portion, i.e., small thrust ripples over a long stroke, can be provided.

Figure 9:
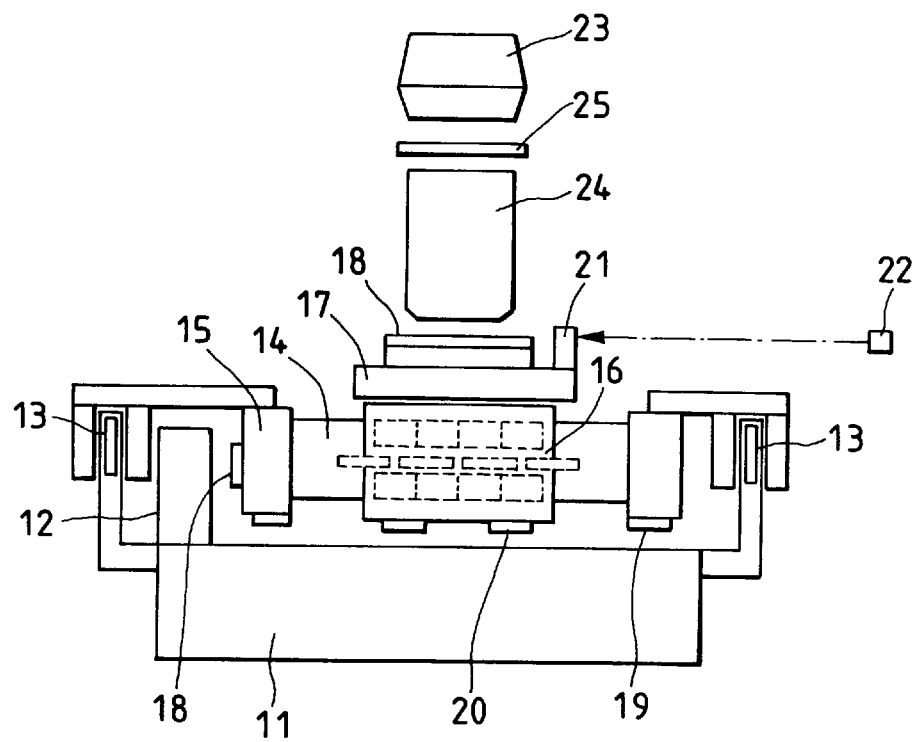
FIG. 9 is a sectional view of an exposure apparatus having a stage apparatus using the linear motor.
Figure 10:
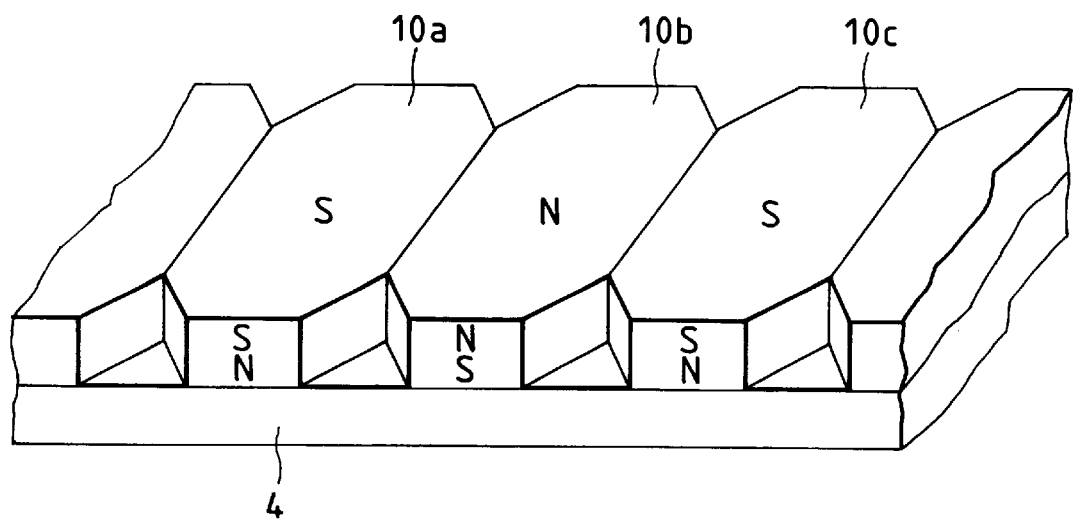
FIG. 10 shows the prior art.

FIG. 9 shows the arrangement of a stage apparatus using the above-mentioned linear motor, and an exposure apparatus which is used for manufacturing a semiconductor device and has the stage apparatus. A guide 12 and the stators of linear motors 13 are fixed on a surface plate 11. Each linear motor 13 has one of the above-mentioned arrangements, i.e., the stator has polyphase electromagnetic coils and the rotor has permanent magnet groups. The rotors of the linear motors 13 are connected to a movable portion 15 and a movable guide 14, and the movable guide 14 is moved in a direction normal to the plane of the drawing by driving the linear motors 13.

The movable portion 15 holds the movable guide 14 by static pressure bearings 19 with reference to the upper surface of the surface plate 11, and by a static pressure bearing 18 with reference to the side surface of the guide 12. A moving stage 17 is arranged to extend over the movable guide 14 and is supported by static pressure bearings 20. The moving stage 17 is moved in the right-and-left direction in the plane of the drawing of FIG. 9 by a linear motor 16 having one of the above-mentioned arrangements with reference to the movable guide 14. The movement of the stage 17 is measured using a mirror 21 fixed to the stage 17 and a laser interferometer 22.

A wafer 18 is checked by a chuck mounted on the stage 17. In order to transfer a circuit pattern onto the wafer 18 by exposure, the circuit pattern on a reticle 25 is transferred in a reduced scale onto the wafer 18 by a light source 23 and a projection optical system 24. Since the above-mentioned linear motors with excellent characteristics are used, a good stage apparatus and exposure apparatus can be realized.

According to the present invention, a good linear motor device which can enjoy low cost and high driving power but has small thrust ripples can be provided. In particular, when the permanent magnet at the terminal end portion of the magnet array has a size smaller than other magnets, a good linear motor which has small thrust ripples even at the terminal end portion, i.e., small thrust ripples over a long stroke, can be provided. When the linear motor is applied to the stage apparatus, a stage apparatus having high positioning precision using the linear motor can be provided. Furthermore, when the linear motor is applied to an exposure apparatus, a good exposure apparatus can be provided.

What is claimed is:

1. A linear motor comprising:
   a coil; and
   a yoke having a plurality of permanent magnets, each of said magnets being of the same rectangular parallelopiped shape and being arranged along a relative moving direction between said coil and said yoke while rotating polarity directions thereof 90° each in turn to generate a nearly sinusoidal magnetic field.

2. A linear motor according to claim 1, wherein each of said permanent magnets has a rectangular parallelopiped shape.

3. A linear motor according to claim 1, wherein a plurality of coils equivalent to said coil are arranged along the moving direction, and are energized at the same time.

4. A stage apparatus for moving a stage using a linear motor of claim 1.

5. A linear motor according to claim 1 wherein said permanent magnets are each fixed to said yoke.

6. A stage apparatus for moving a stage using a linear motor of claim 2.

7. A stage apparatus for moving a stage using a linear motor of claim 3.

8. An exposure apparatus having a stage apparatus of claim 4.

9. An exposure apparatus having a stage apparatus of claim 6.

10. An exposure apparatus having a stage apparatus of claim 7.

11. A linear motor comprising:
    a coil; and
    a yoke having a plurality of permanent magnets which are arranged along a relative moving direction between said coil and said yoke while rotating polarity directions thereof 90° each in turn to generate a nearly ideal sinusoidal magnetic field,
    wherein a permanent magnet having a volume smaller than said plurality of permanent magnets is arranged at a terminal end portion of said plurality of permanent magnets.

12. A stage apparatus for moving a stage using a linear motor of claim 11.

13. An exposure apparatus having a stage apparatus of claim 12.

14. A linear motor comprising:

a coil unit; and a plurality of permanent magnets, each of said magnets being of the same rectangular parallelopiped shape and being arranged along a direction of a driving force generated by said linear motor while rotating polarity directions thereof 90° each in turn to generate a nearly sinusoidal magnetic field.

15. A linear motor comprising:

a coil unit; and a plurality of permanent magnets which are arranged along a direction of a driving force generated by said linear motor while rotating polarity directions thereof 90° each in turn to generate a nearly ideal sinusoidal magnetic field, wherein a permanent magnet having a volume smaller than said plurality of permanent magnets is arranged at a terminal end portion of said plurality of permanent magnets.

16. A linear motor according to claim 14, wherein said coil unit includes a plurality of coils.

17. A linear motor according to claim 15, wherein said coil unit includes a plurality of coils.

* * * * *

UNITED STATES PATENT AND TRADEMARK OFFICE
CERTIFICATE OF CORRECTION

PATENT NO. : 6,025,658

DATED : February 15, 2000

INVENTOR(S) : SHIGETO KAMATA

It is certified that error appears in the above-identified patent and that said Letters Patent is hereby corrected as shown below:

COLUMN 3

Line 1, "id" should read --1d--.

Line 3, "oil" should read --coil--.

Line 60, "$F_1(x) = K \cdot B \cdot I_1 \cdot \sin(290x/a)$" should read
--$F_1(x) = K \cdot B \cdot I_1 \cdot \sin(2\pi x/a)$--.

Signed and Sealed this

Seventeenth Day of April, 2001

*Attest:*

NICHOLAS P. GODICI

*Attesting Officer*  *Acting Director of the United States Patent and Trademark Office*